United States Patent
Lu

(10) Patent No.: US 9,753,365 B2
(45) Date of Patent: Sep. 5, 2017

(54) MASK PLATE

(71) Applicants: Boe Technology Group Co., Ltd., Beijing (CN); Chungdu Boe Optoelectronics Technology Co., Ltd., Sichuan (CN)

(72) Inventor: Bing Lu, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 45 days.

(21) Appl. No.: 14/785,374

(22) PCT Filed: Mar. 10, 2015

(86) PCT No.: PCT/CN2015/073939
§ 371 (c)(1),
(2) Date: Oct. 19, 2015

(87) PCT Pub. No.: WO2016/074387
PCT Pub. Date: May 19, 2016

(65) Prior Publication Data
US 2016/0342078 A1 Nov. 24, 2016

(30) Foreign Application Priority Data
Nov. 11, 2014 (CN) .......................... 2014 1 0642808

(51) Int. Cl.
*G03F 1/38* (2012.01)
*G02F 1/1335* (2006.01)
(Continued)

(52) U.S. Cl.
CPC ............ *G03F 1/38* (2013.01); *G02F 1/13394* (2013.01); *G02F 1/133516* (2013.01);
(Continued)

(58) Field of Classification Search
CPC ..... G03F 1/38; G03F 1/42; G03F 1/48; G03F 1/50; G03F 7/0007; G03F 7/20; G03F 7/2002; G02F 1/133516
(Continued)

(56) References Cited

U.S. PATENT DOCUMENTS

2007/0072093 A1* 3/2007 Sawada ................. G03F 7/2014
430/5

FOREIGN PATENT DOCUMENTS

| CN | 103852969 | 6/2014 |
| CN | 104360579 | 2/2015 |

(Continued)

OTHER PUBLICATIONS

International Search Report and Written Opinion from PCT/CN15/073939 dated Jul. 29, 2015.
(Continued)

*Primary Examiner* — John A McPherson
(74) *Attorney, Agent, or Firm* — Calfee, Halter & Griswold LLP

(57) ABSTRACT

The present disclosure provides a mask plate, belongs to the field of display technology, and can maintain a uniform exposing interval, so that the exposure pattern has a uniform deformation amount and pattern size. A mask plate comprises opaque regions and transparent regions, and spacers of the same height are arranged in the opaque regions. Another mask plate comprises active regions and dummy regions, and spacers of the same height are arranged in the dummy regions. The present disclosure can be applied in a process for fabricating a color film substrate.

11 Claims, 2 Drawing Sheets

(51) Int. Cl.
　　　*G02F 1/1339*　　(2006.01)
　　　*G03F 7/20*　　　(2006.01)
　　　*G03F 1/42*　　　(2012.01)
　　　*G03F 1/50*　　　(2012.01)
　　　*G03F 7/00*　　　(2006.01)
　　　*G02F 1/1362*　　(2006.01)

(52) U.S. Cl.
　　　CPC ............... *G03F 1/42* (2013.01); *G03F 1/50* (2013.01); *G03F 7/20* (2013.01); *G02F 2001/13398* (2013.01); *G02F 2001/136231* (2013.01); *G03F 7/0007* (2013.01)

(58) Field of Classification Search
　　　USPC .......................................... 430/5, 7; 349/106
　　　See application file for complete search history.

(56) References Cited

FOREIGN PATENT DOCUMENTS

| CN | 204178120 | 2/2015 |
| JP | 61260633 | 11/1986 |
| JP | H0829965 | 2/1996 |

OTHER PUBLICATIONS

Office action from Chinese Application No. 201410642808.X dated Nov. 7, 2016.
Office action from Chinese Application No. 201410642808.X dated Oct. 30, 2015.
Office action from Chinese Application No. 201410642808.X dated May 5, 2016.
Decision on Rejection for Chinese Patent Application No. 2017052501919530 dated May 31, 2017.
Decision on Rejection for Chinese Patent Application No. 201410642808.X dated May 31, 2017.

* cited by examiner

MASK PLATE

RELATED APPLICATIONS

The present application is the U.S. national phase entry of PCT/CN2015/073939, with an international filing date of Mar. 10, 2015, which claims the benefit of Chinese Patent Application No. 201410642808.X filed Nov. 11, 2014, the entire disclosures of which are incorporated herein by reference.

FIELD OF THE INVENTION

The present disclosure relates to the field of display technology, and particularly to a mask plate.

BACKGROUND OF THE INVENTION

During fabrication process of a display panel like a liquid crystal display panel, generally several masking process are performed to form the required pattern on a color film substrate. In case the times for masking process increase, the fabrication cost increases. In addition, exposing with a mask plate is accompanied with adverse effects like non-uniform size, pattern deformation.

Currently, the mask plate exposing process in the prior art usually comprises proximity exposing and contact exposing. The difference between proximity exposing and contact exposing lies in whether the mask plate is separate from or adjoins the color film substrate during exposing. In contact exposing, the mask plate is pressed against the color film substrate of the photoresist. Since the mask plate directly contacts the color film substrate, the mask plate is prone to be polluted. As compared with the contact exposing, proximity exposing is applied more widely. In proximity exposing, the mask plate is positioned at a distance above the color film substrate and does not contact the color film substrate. However, since the mask plate does not contact the color film substrate, the interval between the mask plate and the color film substrate is not always uniform. Namely, the exposing interval during exposing is not uniform. As a result, after exposing, the deformation amount of the exposure pattern is not uniform, and the size of exposure pattern is not uniform. Thus, it is an important issue for a skilled in the art to provide a mask plate which enables a uniform exposing interval, so that after exposing the exposure pattern has a uniform deformation amount and uniform size.

SUMMARY OF THE INVENTION

The present disclosure provides a mask plate, which enables a uniform exposing interval, so that the exposure pattern has a uniform deformation amount and a uniform size.

To this end, the following technical solutions are adopted in the present disclosure.

The present disclosure provides a mask plate, which comprises opaque regions and transparent regions, and spacers of the same height are arranged in the opaque regions.

The spacers have a height of 100-300 μm.

An edge of the spacers is spaced from that of the opaque regions by 3-10 μm.

The spacers are located at central regions of the opaque regions.

The spacers are distributed in a continuous or discrete mode.

The spacers are distributed in the continuous mode by a density of one spacer per 24-36 sub pixels.

The spacers have a shape of any one of cylinder, square column, prism, and sphere.

The present disclosure further provides another mask plate, which comprises active regions and dummy regions, and spacers of the same height are arranged in the dummy regions.

The spacers have a height of 100-300 μm.

The spacers are distributed in the continuous mode by a density of one spacer per 0.2-1 million sub pixels.

Correspondingly, the present disclosure provides a method of exposing with a mask plate, in which the mask plate of the present disclosure is applied, and which comprises steps of:

1) arranging the mask plate over a substrate in such a manner that the spacers of the same height on the mask plate contact with the substrate;

2) exposing with the mask plate to form an exposure pattern on the substrate.

The present disclosure provides a mask plate, and spacers of the same height are arranged in opaque regions of the mask plate. The mask plate contacts the color film substrate by means of the spacers. In this way, since the spacers have a uniform height, the interval between the whole mask plate and the color film substrate will be uniform during exposing, i.e., the exposing interval will be uniform. As a result, after exposing with the mask plate, the exposure pattern has a uniform deformation amount and a uniform size.

DETAILED DESCRIPTION OF THE INVENTION

The present disclosure will be elucidated hereinafter in details with reference to the accompanying drawings and embodiments. Apparently, these embodiments only constitute some embodiments of the present disclosure. The scope of the present disclosure is by no means limited to embodiments as set forth herein.

Embodiments of the present disclosure will be described in detail hereinafter by referring to the accompanying drawings.

Figure 1:
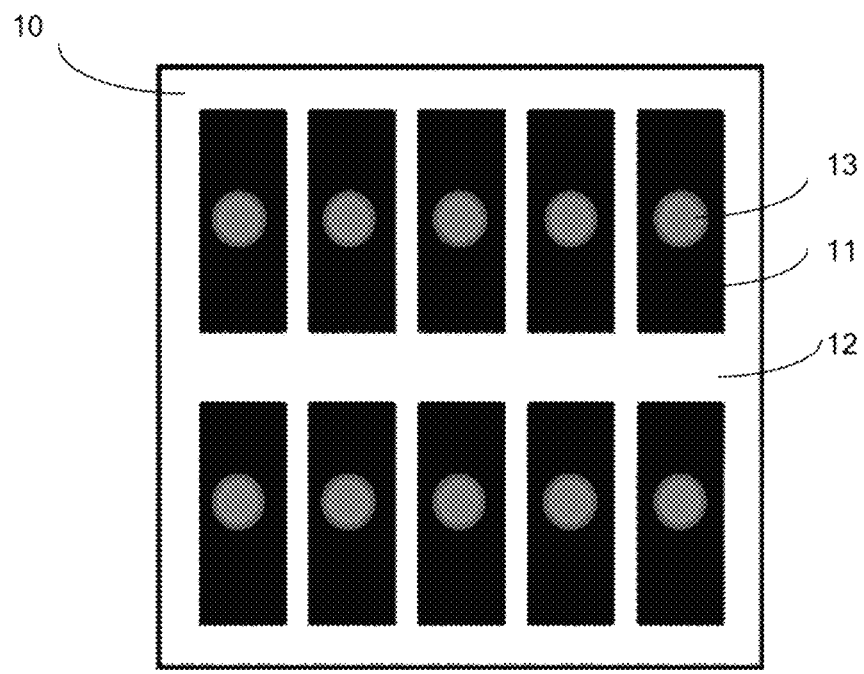
FIG. 1 is a schematic view for a mask plate in an embodiment of the present disclosure.

As shown in FIG. 1, in an embodiment of the present disclosure, a mask plate 10 comprises opaque regions 11 and transparent regions 12, and spacers 13 of the same height are arranged in the opaque regions 11.

The mask plate generally comprises active regions and dummy regions. The active regions refer to pattern regions of the mask plate, and correspond to regions of a substrate where patterns will be formed by exposing with the mask plate. The dummy regions refer to regions by which each unit of active regions are spaced apart from each other, and correspond to regions on the substrate by which regions where patterns will be formed by exposing with the mask plate are spaced apart from each other, and refer to regions which will be removed by cutting subsequently.

The active regions generally are divided into opaque regions and transparent regions. The opaque regions generally comprise an opaque chrome (Cr) layer, and are used to form patterns on the substrate which correspond to the mask plate. The spacers are used to support the mask plate. All spacers in the prior art can be applied in the present disclosure. The present disclosure does no intend to the fabricating method and the material of the spacers. For example, in the mask plate of the present disclosure, spacers of the same height can be arranged in opaque regions of the mask plate by a common photoresist process known in the prior art.

In a mask plate of the present disclosure, spacers of the same height are arranged in opaque regions of the mask plate. The mask plate contacts the color film substrate by means of the spacers. In this way, since the spacers have a uniform height, the interval between the whole mask plate and the color film substrate will be uniform during exposing, i.e., the exposing interval will be uniform. As a result, after exposing with the mask plate, the exposure pattern has a uniform deformation amount and a uniform size.

In an embodiment of the present disclosure, the height of spacers 13 can be 100-300 μm. In the present embodiment, the reason for setting the height of spacers 13 in the above range follows. In the prior art, for sake of security in the proximity exposing, the exposing interval should be set in a certain secure range to prevent collision between the mask plate and the substrate, which otherwise would pollute the mask plate. In case of a large exposing interval, the light suffers from a large deflection during exposing, which will increase the deviation in deformation amount and pattern size of the exposure pattern. Since the certain secure is generally large, the proximity exposing in the prior art usually suffers from a relatively large deviation in deformation amount and pattern size of the exposure pattern. In the present disclosure, the height of spacers defines the interval between the mask plate and the color film substrate during exposing with the mask plate, i.e., the exposing interval during exposing. That is, during exposing with the mask plate, the exposing interval can be 100-300 μm, which is far smaller than "the certain secure range" in the prior art. In this way, as compared with the proximity exposing in the prior art, the mask plate 10 enables a relatively small exposing interval during exposing. As a result, the deviation in deformation amount and pattern size of the exposure pattern is relatively small. In particular, the height of spacers can be 100 μm, 110 μm, 120 μm, 130 μm, 140 μm, 150 μm, 200 μm, 250 μm or 300 μm.

The height of spacers 13 theoretically can be infinitely small, so that theoretically an infinitely small deviation in deformation amount and pattern size of the exposure pattern can be achieved. It is understood that, with the development of process, spacers with a height less than 100 μm, e.g., a height of 80 μm, 70 μm, 60 μm, 50 μm, 40 μm, 30 μm, 20 μm, 10 μm, 5 μm or the like also fall within the concept of the present disclosure. It is understood that a small height of spacers 13 facilitates a small deviation in size of the exposure pattern, and is particularly applicable to products with narrow line width. A small height of spacers 13 facilitates a small exposing interval, a small deflection of light during exposing, and thus a small deviation in size of the exposure pattern. In this way, the cross influence between neighboring opaque regions during exposing is reduced.

In an embodiment of the present disclosure, an edge of spacers 13 can be spaced apart from that of opaque regions 11 by 3-10 μm. The spacers 13 are arranged in opaque regions 11 of the mask plate 10, and do not go beyond opaque regions 11. Thus, it is ensured that spacers 13 will not affect exposure effect of the pattern of mask plate 10 during exposing. A small interval between the edge of spacers and that of opaque regions indicates that the spacers have a large contact surface in the opaque regions, i.e., the spacers provide a large support surface for the mask plate. Thus, the mask plate can be prevented from curvature to different extent, so that it is ensured that a uniform interval is provided between the mask plate and the color film substrate. However, in the case of a small interval between the edge of spacers and that of opaque regions, spacers tend to affect the pattern of the mask plate during exposing with the mask plate. An interval of 3-10 μm between the edge of the spacers 13 and that of the opaque regions 11 not only facilitates a uniform interval between the mask plate and the color film substrate (i.e., a uniform exposing interval), but also prevents the spacers from affecting patterning effect of the mask plate during exposing. For example, the interval between the edge of spacers and that of opaque regions can be 4 μm, 5 μm, 6 μm, 7 μm, 8 μm, 9 μm, or 10 μm.

In an embodiment of the present disclosure, spacers 13 in the opaque regions 11 can be located at central regions of opaque regions 11. In this way, the spacers can uniformly support the mask plate in opaque regions, thus ensuring that the whole mask plate has a uniform curvature, and that the exposing interval is uniform. Of course, the spacers can also be located at non-central regions of opaque regions 11. In this case, spacers can also support the mask plate during exposing with the mask plate, so that the mask plate has a uniform curvature.

In another embodiment of the present disclosure, spacers 13 in opaque regions 11 can be distributed in a continuous mode or a discrete mode. That is, one or more spacers can be arranged in each opaque region. Alternatively, a spacer is arranged in two or more opaque regions. By distributing spacers in opaque regions in a continuous mode, it is beneficial for spacers to uniformly support the mask plate. As a result, the mask plate has a uniform curvature, thus facilitating a uniform exposing interval.

In a preferred embodiment of the present disclosure, spacers 13 can be distributed in the continuous mode by a density of one spacer per 24-36 sub pixels. Namely, by taking the sub pixel as an unit, a spacer is arranged every 24-36 sub pixels. A larger density indicates that more spacers are provided, which provides larger and more uniform support for the mask plate. In this case, a uniform interval between the mask plate and the color film substrate is guaranteed, and thus the exposing interval is uniform. However, in case of a large density, the fabricating cost of the mask plate is accordingly increased, and the over-populated spacers tend to squeeze each other, which may lead to collapse, deformation of spacers and thus lead to a non-uniform interval between the mask plate and the color film substrate. Therefore, the density of one spacer per 24-36 sub pixels facilitates to further improve uniformity of exposing interval. For example, a spacer can be arranged in every 24, 27, 30, 33, or 36 sub pixels.

In another embodiment of the present disclosure, spacers 13 can have a shape of any one of cylinder, square column, prism, and sphere. Spacers of such a shape provide a relatively large contact surface when the pacers contact the mask plate. Namely, the spacers provide a relatively large support for the mask plate, thus ensuring a uniform curvature of the mask plate, and a uniform interval between the mask plate and the color film substrate.

Figure 2:
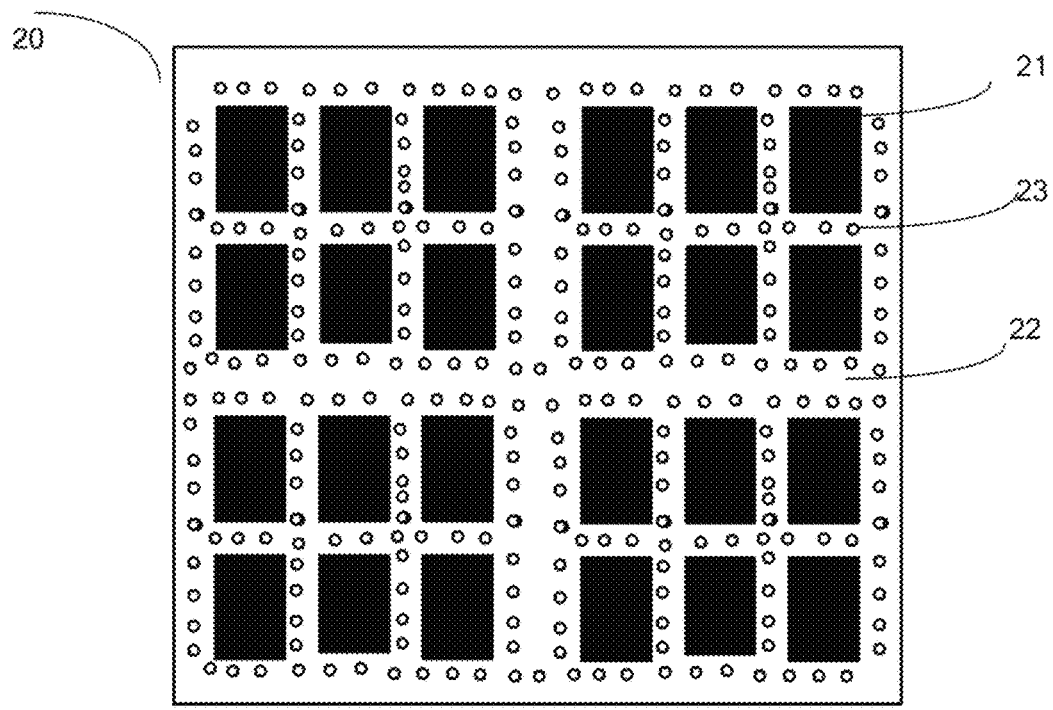
FIG. 2 is a schematic view for another mask plate in an embodiment of the present disclosure.

As shown in FIG. 2, the present disclosure embodiment further provides another mask plate 20, which comprises active regions 21 and dummy regions 22. Spacers 23 of the same height are arranged in the dummy regions 22.

It is understood that spacers 23 and spacers 13 are of the same material, and also used to support the mask plate. The material, fabricating process, height, and distribution mode for spacers 13 are also applicable to spacers 23.

In another mask plate of the present disclosure, spacers of the same height are arranged in opaque regions of the mask plate. The mask plate contacts the color film substrate by means of the spacers. In this way, since the spacers have a uniform height, the interval between the whole mask plate and the color film substrate will be uniform during exposing, i.e., the exposing interval will be uniform. As a result, after exposing with the mask plate, the exposure pattern has a uniform deformation amount and a uniform size.

In an embodiment of the present disclosure, the height of spacers 23 can be 100-300 μm. The height of spacers defines the exposing interval during exposing with the mask plate. Namely, the exposing interval can be 100-300 μm during exposing with the mask plate. For example, the exposing interval can be 100 μm, 110 μm, 120 μm, 130 μm, 140 μm, 150 μm, 200 μm, 250 μm or 300 μm. In this way, as compared with the proximity exposing in the prior art, the mask plate 10 enables a relatively small exposing interval during exposing. As a result, the deviation in deformation amount and pattern size of the exposure pattern is relatively small. Similar with the case of spacers 13, the height of spacers 23 theoretically can be infinitely small, so that a smaller exposing interval can be obtained.

In another embodiment of the present disclosure, spacers 23 are distributed in a continuous mode by a density of one spacer per 0.2-1 million sub pixels. A smaller density indicates spacers provide small support for the mask plate. Thus, in the present disclosure, the density can be one spacer per 0.2 million, 0.3 million, 0.5 million, 0.6 million, 0.9 million, or 1 million sub pixel. In this way, sufficient spacers can be arranged to provide sufficient support for the mask plate, and thus provide a uniform interval between the mask plate and the substrate.

The mask plates 10, 20 in embodiments of the present disclosure will be described in detail with reference to FIG. 1 and FIG. 2.

The mask plates 10, 20 of the present disclosure are shown in FIG. 1 and FIG. 2, respectively. The mask plates 10, 20 contact the color film substrate by means of spacers 13, 23 of the same height, and ensure that the exposing interval during exposing is uniform, so that the exposure pattern has a uniform deformation amount and pattern size. The difference between mask plates 10, 20 lies in that spacers 13, 23 are arranged in different regions of the mask plate, respectively. Spacers 13 are located at opaque regions 11 of active regions of the mask plate 10, while spacers 23 are located at dummy regions 22 of the mask plate 20. Thus, the mask plate 10 is particularly suitable for active regions with relatively large transparent regions, and the mask plate 20 is particularly suitable for active regions with relatively small transparent regions.

In particular, spacers 23 are arranged in dummy regions 22 of the mask plate 20. Thus, in case photolithography process is performed against a plurality of layers in sequence, spacers always contact the same dummy regions of the color film substrate during exposing for each layer, and have no effect on the photolithography patterns which have been completed in the preceding processes. As for the mask plate 10 of the present disclosure, spacers 13 are arranged in active regions. In a process during exposing, the spacers may contact the photolithography patterns which have been completed in the preceding processes, and lead to black spots on these photolithography patterns.

For example, reference is made to BM (Black Matrix), R, G, B, ITO/OC (Over Coat), PS (Post Spacer) processes in current processes for the color film substrate. The mask plate 10 of the present disclosure is applied in the preceding BM, R, G processes. In these preceding BM, R, G processes, active regions of the mask plate 10 comprise relatively large transparent regions, and opaque regions 11 are arranged sparsely. Spacers are arranged in opaque regions and are arranged in a manner which is not so dense. By arranging spacers of an appropriate density, contact regions between the spacers and the color film substrate during exposing will not fall upon the pattern regions formed in the preceding process. Thus, a uniform deformation amount and pattern size of the exposure pattern is realized, and the exposure effect of the following process will not be affected. The mask plate 20 of the present disclosure, in which spacers are arranged in dummy region, is applied in the subsequent B, ITO/OC, PS processes. In these processes, transparent regions of the active regions are rather small. In addition, once completing the preceding processes, opaque regions of active regions of the mask plate have already been provided with dense spacers. If spacers were still arranged in opaque regions in this case, spacers would tend to squeeze each other, and the substrate would be polluted and pixels would be damaged. Since the substrate has been provided with pattern regions formed in the preceding processes, spacers arranged in active regions would contact the underlying pattern regions during exposing. As a result, black spots tend to be formed on the underlying pattern regions formed in the preceding processes.

Figure 3:
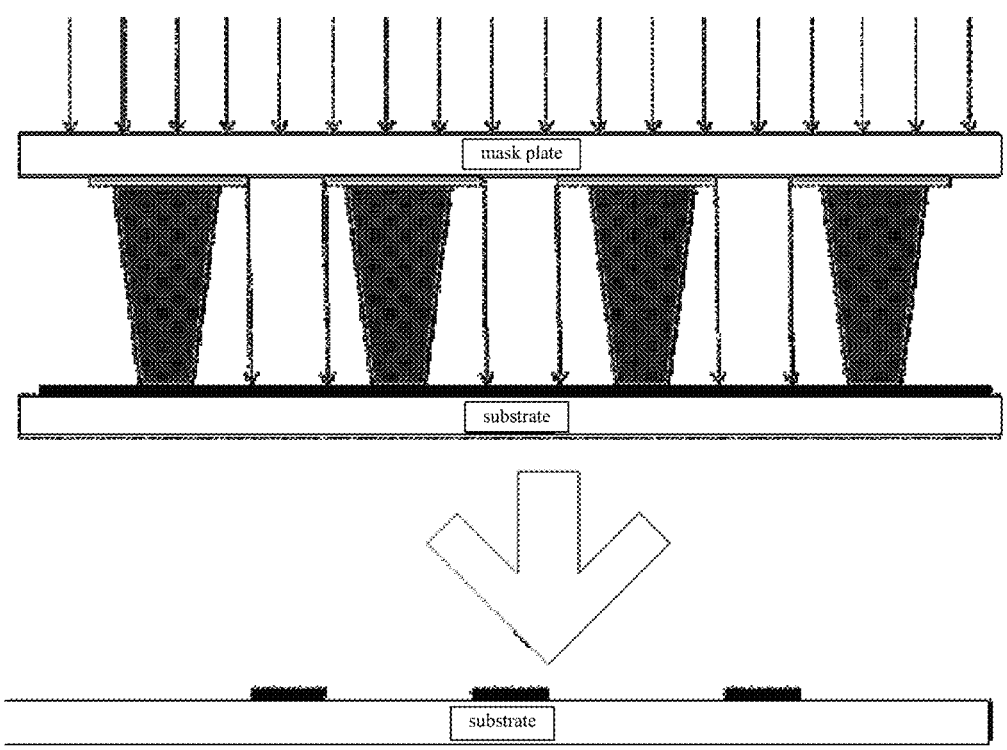
FIG. 3 is a schematic view for a method of exposing with a mask plate in an embodiment of the present disclosure.

Accordingly, as shown in FIG. 3, an embodiment of the present disclosure provides a method of exposing with a mask plate. The mask plates 10, 20, of the present disclosure are applied in this method. The method comprises steps of:

1) arranging the mask plate over a substrate in such a manner that the spacers of the same height on the mask plate contact with the substrate;

2) exposing with the mask plate to form an exposure pattern on the substrate.

In the method of exposing with a mask plate of the present disclosure, the mask plate of the present disclosure is applied. During exposing, the mask plate contacts the color film substrate by means of spacers of the same height, thus maintaining a uniform interval between the mask plate and the color film substrate. Namely, the exposing interval is maintained uniform during exposing, thus providing a uniform deformation amount and pattern size of the exposure pattern. Besides, the mask plate contacts the color film substrate by means of spacers, thus avoiding the necessity of pressing the mask plate against photoresist, as the case for contact exposing. Thus, it is possible to prevent the mask plate from be polluted, and it is not necessary to arrange the mask plate on the substrate by means of vacuum suction, cylinder pressure or the like. Therefore, the method of exposing with a mask plate of the present embodiment is easy and simple to manipulate.

Although the present disclosure has been described above with reference to specific embodiments, it should be understood that the limitations of the described embodiments are merely for illustrative purpose and by no means limiting. Instead, the scope of the disclosure is defined by the appended claims rather than by the description, and all variations that fall within the range of the claims are intended to be embraced therein. Thus, other embodiments than the specific ones described above are equally possible within the scope of these appended claims.

The invention claimed is:

1. A mask plate, comprising opaque regions and transparent regions, wherein spacers of the same height are arranged in said opaque regions, and an edge of said spacers is spaced from an edge of said opaque regions by 3-10 µm.

2. The mask plate of claim 1, wherein said spacers have a larger than 200 and no larger than 300 µm.

3. The mask plate of claim 1, wherein said spacers are located at central regions of said opaque regions.

4. The mask plate of claim 1, wherein said spacers are distributed in a continuous or discrete mode.

5. The mask plate of claim 4, wherein said spacers are distributed in the continuous mode by a density of one spacer per 24-36 sub pixels.

6. The mask plate of claim 1, wherein said spacers have a shape of any one of cylinder, square column, prism, and sphere.

7. A method of exposing with a mask plate, wherein the mask plate of claim 1 is applied in the method, and the method comprises steps of:
   1) arranging the mask plate over a substrate in such a manner that said spacers of the same height on said mask plate contact with said substrate;
   2) exposing with said mask plate to form an exposure pattern on said substrate.

8. A mask plate, comprising active regions and dummy regions, wherein spacers of the same height are arranged in said dummy regions, and an edge of said spacers is spaced from an edge of said dummy regions by 3-10 µm.

9. The mask plate of claim 8, wherein said spacers have a height larger than 200 and no larger than 300 µm.

10. The mask plate of claim 8, wherein said spacers are distributed in a continuous mode by a density of one spacer per 0.2-1 million sub pixels.

11. A method of exposing with a mask plate, wherein the mask plate of claim 8 is applied in the method, and the method comprises steps of:
   1) arranging the mask plate over a substrate in such a manner that said spacers of the same height on said mask plate contact with said substrate;
   2) exposing with said mask plate to form an exposure pattern on said substrate.

* * * * *